United States Patent
Iwase (10) Patent No.: US 10,499,497 B2
(45) Date of Patent: Dec. 3, 2019

(54) STRETCHABLE CIRCUIT BOARD AND STRETCHABLE CIRCUIT BOARD MANUFACTURING METHOD

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 16/194,422

(22) Filed: Nov. 19, 2018

(65) Prior Publication Data

US 2019/0166689 A1    May 30, 2019

(30) Foreign Application Priority Data

Nov. 27, 2017  (JP) .................... 2017-227136

(51) Int. Cl.
| | |
|---|---|
| H05K 1/02 | (2006.01) |
| H05K 1/03 | (2006.01) |
| H05K 1/09 | (2006.01) |
| H05K 1/14 | (2006.01) |
| H05K 3/06 | (2006.01) |
| H05K 3/36 | (2006.01) |
| H05K 3/38 | (2006.01) |

(52) U.S. Cl.
CPC ......... *H05K 1/0283* (2013.01); *H05K 1/0393* (2013.01); *H05K 1/092* (2013.01); *H05K 1/147* (2013.01); *H05K 2201/0133* (2013.01); *H05K 2201/2009* (2013.01)

(58) Field of Classification Search
CPC .. H05K 1/02; H05K 1/03; H05K 1/09; H05K 1/14; H05K 3/06; H05K 3/36; H05K 3/38
USPC ........................................................ 174/254
See application file for complete search history.

(56) References Cited

U.S. PATENT DOCUMENTS

| | | | |
|---|---|---|---|
| 10,285,266 B2 * | 5/2019 | Kamakura | ........... H05K 1/0281 |
| 2017/0034907 A1 * | 2/2017 | Iwase | .................... H05K 1/0283 |
| 2017/0099730 A1 * | 4/2017 | Iwase | ..................... H05K 1/092 |
| 2017/0245362 A1 * | 8/2017 | Iwase | .................... H05K 1/0283 |
| 2018/0070446 A1 * | 3/2018 | Takahashi | ............... B23B 27/18 |
| 2018/0092206 A1 * | 3/2018 | Iwase | .................... A61B 5/6801 |
| 2018/0116049 A1 * | 4/2018 | Iwase | ................. H01R 12/7041 |
| 2019/0166688 A1 * | 5/2019 | Iwase | .................... H05K 1/0283 |

FOREIGN PATENT DOCUMENTS

WO    2017/122379 A1    7/2017

* cited by examiner

*Primary Examiner* — Xiaoliang Chen
(74) *Attorney, Agent, or Firm* — Studebaker & Brackett PC (57) ABSTRACT

Provided is a stretchable circuit board including: a stretchable base material having stretchability and including a stretchable wiring line on one main surface; an electrode formed on at least the main surface of the stretchable base material and connected to the stretchable wiring line; an adhesive layer directly or indirectly bonded to the main surface on which the electrode is formed and formed in a region of the main surface other than an electrode region including the electrode; and an adhesive layer separator detachably bonded to the adhesive layer and having an opening formed at a position corresponding to at least part of the electrode region.

6 Claims, 7 Drawing Sheets

STRETCHABLE CIRCUIT BOARD AND STRETCHABLE CIRCUIT BOARD MANUFACTURING METHOD

CROSS-REFERENCE TO RELATED APPLICATION

This application claims priority from Japanese Patent Application No. 2017-227136 filed with the Japan Patent Office on Nov. 27, 2017, the entire content of which is hereby incorporated by reference.

BACKGROUND

1. Technical Field

The present disclosure relates to a stretchable wiring substrate and the method for manufacturing the stretchable wiring substrate.

2. Related Art

In the field of IoT and health care, acquisition of biosignals from a target person has been performed. For acquisition of the biosignals, a biosensor directly attached to the body (hereinafter referred to as a "living body") of the target person to detect a muscle potential etc. is suitable. The biosensor attached to the body preferably closely contacts the living body by stretching in accordance with motion of the living body. Thus, the biosensor includes a substrate having stretchability. The biosensor is attached to the living body by an adhesive sheet provided on the substrate. Well-known examples of the biosensor include a biosignal measurement device described in WO 2017/122379. The biosignal measurement device described in this publication includes electrodes (signal acquirers) configured to detect signals from a living body. Most of biosignals are relatively-small signals. Thus, the electrodes exhibiting high adhesiveness to the living body contact the living body so that measurement accuracy can be enhanced. One method for enhancing adhesiveness between each electrode and the living body is contact between each electrode to which conductive cream is applied and the living body. A main material of the conductive cream is sodium chloride, propylene glycol, etc. These materials provide the effect of lowering electric resistance between each electrode and the living body to facilitate input of the biosignals to the electrodes.

SUMMARY

A stretchable circuit board according to the present disclosure includes: a stretchable base material having stretchability and including a stretchable wiring line on one main surface; an electrode formed on at least the main surface of the stretchable base material and connected to the stretchable wiring line; an adhesive layer directly or indirectly bonded to the main surface on which the electrode is formed and formed in a region of the main surface other than an electrode region including the electrode; and an adhesive layer separator detachably bonded to the adhesive layer and having an opening formed at a position corresponding to at least part of the electrode region.

DETAILED DESCRIPTION

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

However, multiple electrodes are formed at the biosensor. Moreover, an electrode area decreases as the size of the biosensor decreases. The conductive cream is manually applied to each electrode by a user of the biosensor or an engineer measuring the biosignals. In the case of using conductive cream exhibiting relatively-high viscosity, it is difficult to uniformly apply a proper amount of conductive cream onto the electrodes. For this reason, there is a probability that when the biosensor is attached to the living body, the conductive cream adheres to other portions than the electrodes, in this case, there is, due to the adhering conductive cream, the probability of, e.g., a change in wiring resistance or short circuit between wiring lines. It is obvious that due to the change in wiring resistance, proper biosignals cannot be obtained via the electrodes. Moreover, variation in the amount of conductive cream applied to the multiple electrodes results in variation in the intensity of each obtained biosignal. A stretchable circuit board of the present disclosure has been developed in view of such a point. That is, the present disclosure relates to a stretchable circuit board configured so that conductive cream can be properly and easily applied to each electrode and the method for manufacturing the stretchable circuit board.

A stretchable circuit board according to the present disclosure includes: a stretchable base material having stretchability and including a stretchable wiring line on one main surface; an electrode formed on at least the main surface of the stretchable base material and connected to the stretchable wiring line; an adhesive layer directly or indirectly bonded to the main surface on which the electrode is formed and formed in a region of the main surface other than an electrode region including the electrode; and an adhesive layer separator detachably bonded to the adhesive layer and having an opening formed at a position corresponding to at least part of the electrode region.

A method for manufacturing a stretchable circuit board according to the present disclosure includes, in a sequence set forth, steps of:

A) detaching a first adhesive layer separator bonded to a first surface from an adhesive layer having the first adhesive layer separator and a second adhesive layer separator bonded to a back surface of the first surface and having an opening; and B) directly or indirectly bonding the adhesive layer to at least one main surface after the adhesive layer and a stretchable base material having an electrode formed on the at least one main surface and a stretchable wiring line formed connected to the electrode have been position-adjusted such that the opening corresponds to a position of the electrode.

According to the embodiment of the present disclosure, the stretchable circuit board configured so that the conductive cream can be properly and easily applied to each electrode and the method for manufacturing the stretchable circuit board can be provided.

Hereinafter, one embodiment of the present disclosure will be described with reference to the drawings. Note that in all drawings, similar reference numerals are used to represent similar elements. Moreover, overlapping description will be omitted as necessary. Further, the drawings of the present embodiment are for describing a configuration and a function of a stretchable circuit board of the disclosure. The drawings do not always illustrate precise length, width, thickness, etc. of the stretchable circuit board. Further, the embodiment of the present disclosure is not limited to a shape and a design illustrated in the drawings of the embodiment. These shape and design may be changed as necessary.

(Stretchable Circuit Board)

Figure 1:
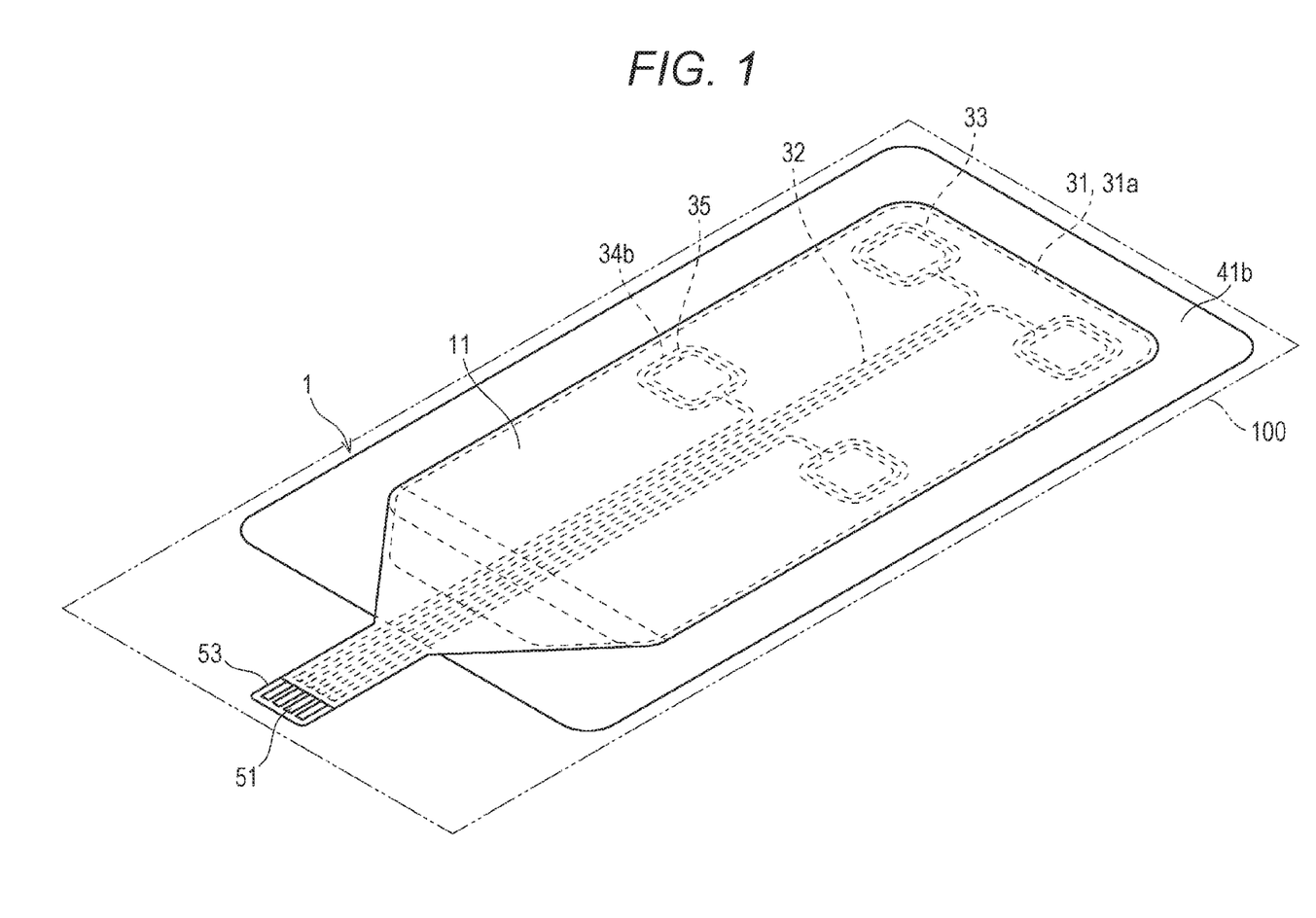
FIG. 1 is a perspective view of a stretchable circuit board of one embodiment of the present disclosure.
Figure 2A:
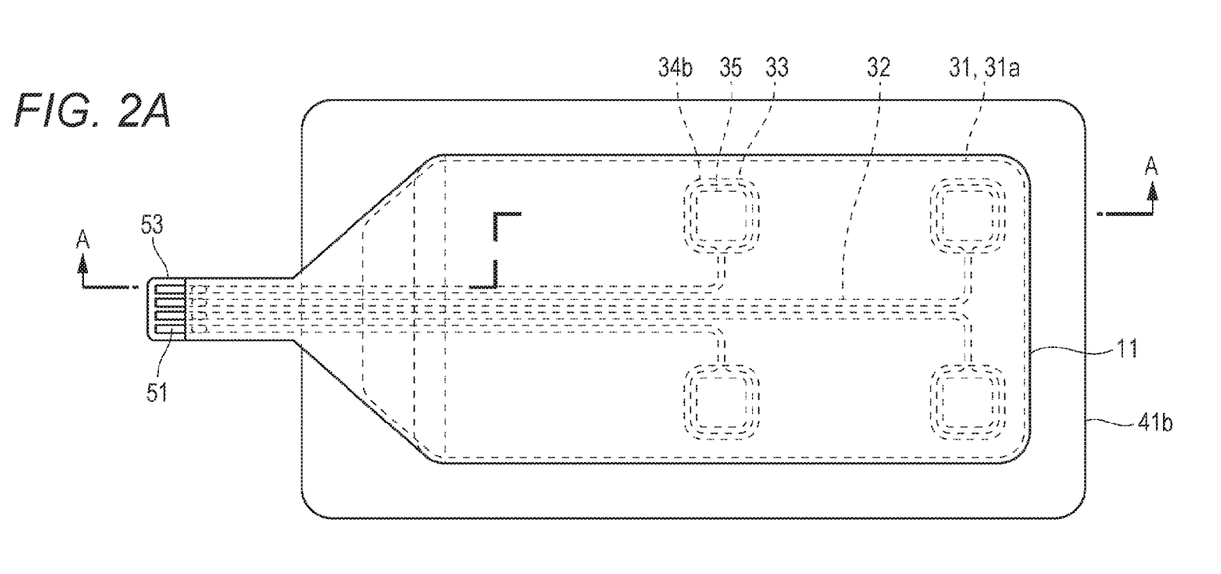
FIG. 2A is an upper view of the stretchable circuit board of the present embodiment.
Figure 2B:
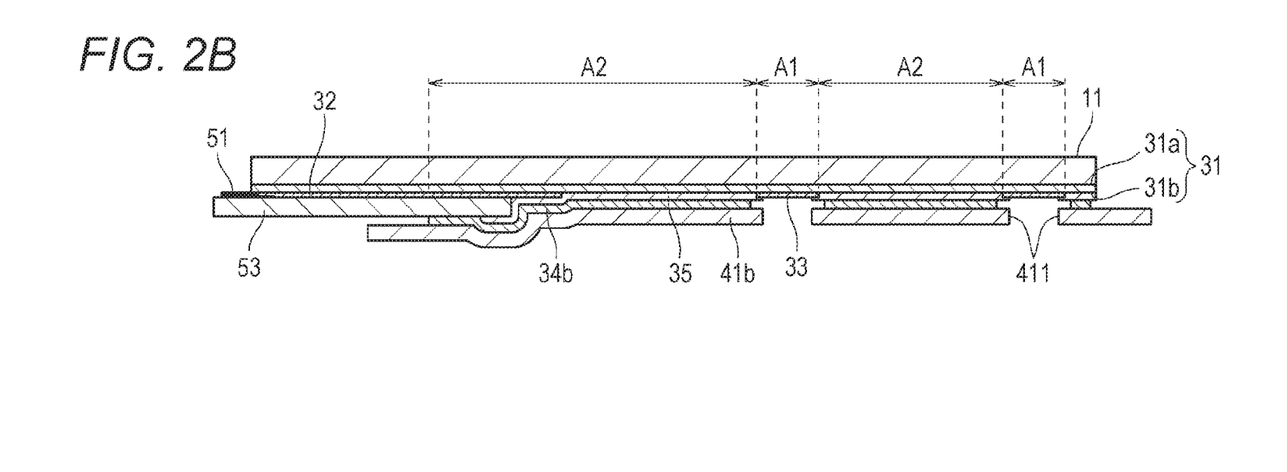
FIG. 2B is a longitudinal sectional view of the stretchable circuit board illustrated in FIG. 2A from the side of arrows A and A of the figure.

FIG. 1 is a perspective view of a stretchable circuit board 1 of the present embodiment. In the present embodiment, the stretchable circuit board 1 used as a sensor attached to a living body to measure a biosignal such as a muscle potential will be described by way of example. In the present embodiment, a side of the stretchable circuit board 1 facing a living body side upon attachment to the living body will be referred to as a "back (a back surface, a back side)" of the stretchable circuit board 1. Moreover, a side of the stretchable circuit board 1 opposite to the back will be referred to as a "front (a front surface, a front side)". FIG. 1 is an upper perspective view of the stretchable circuit board 1 from the front side. FIG. 2A is an upper view of the stretchable circuit board 1. FIG. 2B is a longitudinal sectional view of the stretchable circuit board 1 illustrated in FIG. 2A from the side of arrows A and A of the figure. The stretchable circuit board 1 illustrated in FIGS. 1, 2A, and 2B is in a state before attachment to the living body. A stretchable base material separator 11 is bonded to the outermost layer of the front surface. An adhesive layer separator 41b is bonded to the outermost layer of the back surface.

FIG. 1 illustrates the stretchable circuit board 1 embedded in a packing material 100. FIGS. 2A and 2B illustrate the stretchable circuit board 1 after the stretchable circuit board 1 has been taken out of the packing material 100. That is, the stretchable circuit board 1 of the present embodiment may have the packing material 100 configured to embed the stretchable circuit board 1 itself. Examples of the packing material 100 may include a gussetless bag body using, as a material, a resin film material such as PET or a resin film (a so-called aluminum bag) on which a thin aluminum film is vapor-deposited. The packing material 100 can suppress, e.g., germs, water, or gas from entering the bag body from the outside. The packing material 100 may separately pack the stretchable circuit board 1, or may collectively pack multiple stretchable circuit boards. The configuration including the stretchable circuit board 1 packed in the packing material 100 is suitable for the stretchable circuit board 1 used with the stretchable circuit board 1 being attached to the living body as in the present embodiment.

(Entire Configuration)

The stretchable circuit board 1 illustrated in FIGS. 1, 2A, and 2B includes a stretchable base material 31 and an adhesive layer 34b. The stretchable base material 31 has stretchable wiring lines 32 provided on the back surface 31b as one main surface, and electrodes 33 formed connected to the stretchable wiring lines 32. The adhesive layer 34b is directly or indirectly bonded to the back surface 31b. Moreover, the adhesive layer 34b is formed in a non-electrode region 42 as a region other than an electrode region A1 including the electrodes 33. That is, the stretchable base material 31 of the stretchable circuit board 1 illustrated in FIG. 1 is a sheet-shaped thin film, and has main surfaces (the front surface 31a, the back surface 31b) at the front and back thereof. In the present embodiment, the stretchable wiring lines 32 are formed on the back surface 31b of the main surfaces of the stretchable base material 31. Moreover, the electrodes 33 are formed on the back surface 31b of the stretchable base material 31. Biosignals input to the electrodes 33 are input to a not-shown external element via the stretchable wiring lines 32. In the present embodiment, the electrodes 33 are provided on the back surface 31b as one main surface. Note that the present embodiment is not limited to such a configuration. The phrase "one main surface" in the present embodiment means at least one main surface of the stretchable base material 31. Such a phase does not specify a certain main surface. Thus, in the stretchable circuit board 1, the electrodes 33 may be provided on the front surface 31a. Alternatively, the substrate may have a multilayer structure including the electrodes 33 formed not only on the back surface 31b but also on the front surface 31a on the opposite side. The "adhesive layer 34b formed in the non-electrode region A2" includes not only an adhesive layer 34b formed across the entirety of the non-electrode region 42, but also an adhesive layer 34b formed only in part of the non-electrode region 42. Further, the adhesive layer 34b also includes an adhesive layer 34b formed in the non-electrode region A2 and part of the electrode region A1.

Moreover, at the stretchable circuit board 1 of the present embodiment, a stretchable cover 35 as a cover member configured to protect the stretchable wiring lines 32 is provided between the back surface 31b of the stretchable base material 31 and the adhesive layer 34b. In the stretchable circuit board 1, the adhesive layer 34b is indirectly bonded to the back surface 31b via the stretchable cover 35. Note that the first embodiment is not limited to the configuration including the stretchable cover 35 as an essential member. As long as the adhesive layer 34b has a sufficiently-high insulating resistance value and has no film defect such as a pinhole, the first embodiment may have a configuration including an adhesive layer 34b directly bonded to a stretchable base material 31. According to such a configuration, the adhesive layer 34b can be substantially used as a substitute for the stretchable cover 35. Thus, a great advantage that insulating reliability of the stretchable circuit board 1 can be maintained while the step of forming the stretchable cover 35 can be omitted is obtained.

The stretchable circuit board 1 is attached to the living body. Thus, the stretchable circuit board 1 includes, on the back surface thereof, the adhesive layer 34b. The adhesive layer separator 41b is bonded to the adhesive layer 34b. The adhesive layer separator 41b reduces, for example, adherence of a foreign substance to the adhesive layer 34b or wrinkling of the stretchable base material 31 due to the adhesive layer 34b attached to an unintended portion. In the present embodiment, an opening 411 is formed at a position corresponding to at least part of the electrode region A1 of the adhesive layer separator 41b bonded to the adhesive layer 34b. The "opening 411 formed at the position corresponding to at least part of the electrode region A1" includes an opening 411 formed at a position corresponding to part or the entirety of the electrode region A1. Further, in a case where there are multiple electrode regions A1, the opening 411 includes an opening 411 formed at a position corresponding to part of each of the multiple electrode regions A1. According to the stretchable circuit board 1 of the present embodiment, conductive cream can be applied onto the electrodes 33 by means of the adhesive layer separator 41b as a mask without the need for detachment of the adhesive layer separator 41b. Moreover, after application of the conductive cream, the adhesive layer separator 41b can be detached. With this configuration, the conductive cream remains only on the electrodes 33. This can reduce a change in wiring resistance or occurrence of electric short between adjacent ones of the electrodes 33 due to the conductive cream adhering to other portions than the electrodes 33.

Moreover, in the present embodiment, the electrode region A1 where no adhesive layer 34b is formed includes the opening 411 of the adhesive layer separator 41b. In other words, the opening 411 of the adhesive layer separator 41b is smaller than the electrode region A1. Further, the opening 411 of the adhesive layer separator 41b is smaller than the size of an opening of the adhesive layer 34b. That is, as illustrated in FIGS. 2A and 2B, the opening 411 is, in the present embodiment, formed slightly inward of the electrode 33 with respect to the periphery of the electrode 33. The opening 411 of the present embodiment is formed inside the electrode region A1, and covers part of the electrode region A1. With this configuration, oozing of the adhesive layer 34b through an end surface of the opening 411 can be reduced according to the present embodiment. Moreover, even when the conductive cream applied into the opening 411 expands outward from an edge portion of the opening 411, excessive adherence of the conductive cream to the outside of the electrode 33 is reduced.

The stretchable base material 31 is the sheet-shaped thin film. A surface of the stretchable base material 31 exhibits slight tackiness. Thus, the stretchable base material 31 alone is difficult to handle, and exhibits tackiness. Thus, the stretchable base material 31 is bonded to the stretchable base material separator 11. The stretchable circuit board 1 has a film base material 53 overlapping with part of the stretchable base material 31. An end portion of the film base material 53 does not overlap with the stretchable base material 31, and has multiple external terminals 51. The stretchable wiring lines 32 are each connected to the external terminals 51. The external terminals 51 are connected to a not-shown element such as a microcomputer. The biosignals input to the electrodes 33 are input to the element, and then, are processed. Note that the processing in the element varies according to use of a biosensor. Examples of conceivable processing include signal filtering and amplification, and measurement, counting, and recording of a signal value.

Next, each member described above will be described.
(Film Base Material)
The film base material 53 is a member exhibiting flexibility. The film base material 53 has a greater Young's modulus than that of the stretchable base material 31. Note that the film base material 53 of the present embodiment has lower stretchability than that of the stretchable base material 31. That is, the film base material 53 is substantially little stretchable. A material of the film base material 53 is not specifically limited. Examples of the available material may include less-slidable, corrosive resistant, high-strength synthetic resin such as polyethylene terephthalate (PET), polyethylene naphthalate (PEN), polyimide (PI), polyphenylene sulfide (PPS), and fluorine resin. In addition, a paper material exhibiting appropriate durability, such as cellulose nanofiber paper, may be used as the film base material 53.

The thickness of the film base material 53 is equal to or greater than 10 μm and equal to or less than 200 μm, preferably equal to or greater than 25 μm and equal to or less than 150 μm, and more preferably equal to or greater than 50 μm and equal to or less than 100 μm. Moreover, the thickness of the film base material 53 is preferably greater than that of the stretchable base material 31. When the thickness of the film base material 53 is within the above-described range, in-plane rigidity of a region where the external terminals 51 are formed can be sufficiently enhanced. In addition, the entire thickness of the stretchable circuit board 1 can be reduced.
(Stretchable Base Material)

The stretchable base material 31 has higher stretchability than that of the film base material 53. Examples of a preferred material forming the stretchable base material 31 may include elastomer materials such as nitrile rubber, latex rubber, and urethane-based elastomer. Note that the material is not limited to these examples. Specifically, a urethane-based elastomer sheet for medical use is used so that high safety can be obtained even in the case of attachment to the skin of a human body.

The thickness of the stretchable base material 31 is not specifically limited. Note that a preferred thickness is, for example, equal to or less than 100 considering prevention of interference with stretching motion of a target object (a target surface) to which the stretchable circuit board 1 is applied. The thickness of the stretchable base material 31 is more preferably equal to or less than 25 μm, and much more preferably equal to or less than 10 μm.

The maximum degree of elongation of the stretchable base material 31 is preferably equal to or higher than 10%, more preferably equal to or higher than 50%, much more preferably equal to or higher than 100%, and still much more preferably equal to or higher than 200%. The stretchable base material 31 including the above-described material can exhibit a maximum elongation degree of equal to or higher than 300%, for example. The maximum degree of elongation of the stretchable base material 31 as described herein indicates the maximum elongation degree of elastically-deformable stretching in one direction in a plane. The degree of elongation in the present specification can be converted into the rate of elongation in one direction in the plane in response to force application with respect to dimensions (dimensions with an elongation degree of 0%) in the case of no external force application. For example, in a case where the degree of elongation is 50%, the rate of elongation is 1.5 times as large as the dimensions with an elongation degree of 0%. When the degree of elongation is 100%, the rate of elongation is twice as large as the dimensions with an elongation degree of 0%.
(Stretchable Cover)

As described above, the stretchable wiring lines 32 having stretchability are formed on the stretchable base material 31. The stretchable cover 35 covers at least part of the stretchable wiring lines 32 to protect the stretchable wiring lines 32. The stretchable cover 35 preferably includes an insulating stretchable material. For example, an elastomer material can be used as the stretchable cover 35. A resin material common to the stretchable base material 31 may be used. Thus, the stretchable wiring lines 32 can be protected without lowering of the stretchability of the stretchable base material 31. The stretchable cover 35 produced in a sheet shape in advance is, as the stretchable cover 35 of the present embodiment, bonded and joined to the film base material 53 and the stretchable base material 31. The thickness of the stretchable cover 35 is not specifically limited. Note that the thickness is preferably equal to or less than 100 µm, more preferably equal to or less than 50 µm, and much more preferably equal to or less than 30 µm, considering prevention of interference with stretchability of the stretchable circuit board 1.

(Stretchable Wiring Line)

The multiple external terminals 51 are formed at the end portion of the film base material 53. In the present embodiment, the external terminals 51 are directly connected to the multiple stretchable wiring lines 32 in one-to-one correspondence. The external terminals 51 and wiring portions are joined to each other by connection by laminate or pressing, for example. The external terminals 51 can be, for example, formed by screen printing by means of contact point carbon paste with excellent abrasion resistance. Instead of the carbon paste, conductive paste used for the stretchable wiring lines 32 or the electrodes 33 may be used. The stretchable wiring lines 32 are, by means of elastomer as a binder, made of a material containing conductive paste to which a conductive filler typified by, e.g., Ag and Au is added. The stretchable wiring lines 32 can be, for example, printed and formed by a screen printing method using the conductive paste. In this case, the stretchable wiring lines 32 and the electrodes 33 can be printed and formed simultaneously. The thickness dimension and width dimension of the stretchable wiring line 32 can be determined based on a change amount when resistance of the stretchable wiring line 32 when no load is applied to the stretchable base material 31 changes upon stretching of the stretchable base material 31. In addition, these dimensions can be determined based on limitations on the thickness dimension and width dimension of the entirety of the stretchable circuit board 1. Considering that favorable stretchability which can follow a dimension change upon stretching of the stretchable base material 31 is ensured, the width dimension of the stretchable wiring line 32 is preferably equal to or less than 1000 µm, more preferably equal to or less than 500 µm, and much more preferably equal to or less than 200 µm. The thickness dimension of each stretchable wiring line 32 may be equal to or less than 25 µm. Preferably, the thickness dimension is equal to or greater than 10 µm and equal to or less than 15 µm.

(Adhesive Layer)

For producing the adhesive layer 34b, punching into such a shape that the electrodes 33 are exposed is performed for a sheet material formed by application of an adhesive by, e.g. a coating method. The adhesive layer 34b produced as described above is bonded to the stretchable cover 35 after having been produced as a component separated from the stretchable base material 31, the stretchable cover 35, etc.

In the present embodiment, the adhesive layer 34b includes a resin composition which can exhibit adhesion to an attachment target surface right after the adhesive layer 34b has been attached to the attachment target surface and can repeatedly exhibit the adhesion depending on a state of the attachment target surface. Such properties of the adhesive are different from properties of an adhesive in the form of liquid or gel before bonding and in the form of solid after drying. Moreover, in addition to the above-described "adhesive", a "gel sheet" containing an electrolyte component and exhibiting both properties of liquid and solid to stably hold a constantly-wet-state can be applied. The adhesive and the gel sheet preferably exhibit biological safety such that no adverse effect is provided to a living tissue typified by the skin etc. Thus, an adhesive used for a first-aid adhesive tape or a surgical tape is used for the adhesive layer 34b. Examples of such an adhesive may include an acrylic-based adhesive and a rubber-based adhesive.

(Adhesive Layer Separator, Stretchable Base Material Separator)

Any of the adhesive layer separator 41b and the stretchable base material separator 11 is formed in such a manner that paper or a polyethylene terephthalate (PET) film as a base material is coated with a remover. In a case where the base material is the paper, a barrier layer may be provided between the base material and the remover to reduce penetration of the remover into the paper. Examples of the remover include a silicone-based remover and a non-silicone-based remover. The silicone-based remover exhibits excellent thermal resistance, and therefore, is suitable for a separator targeted for a hot pressing step. Moreover, examples of the non-silicone-based remover include a fluorine-based remover. The fluorine-based remover exhibits cleanness (properties leading to no dust), antistatic properties, and high adhesiveness, and therefore, is mainly suitable for electronic equipment.

(Method for Manufacturing Stretchable Circuit Board)

Figure 6A:
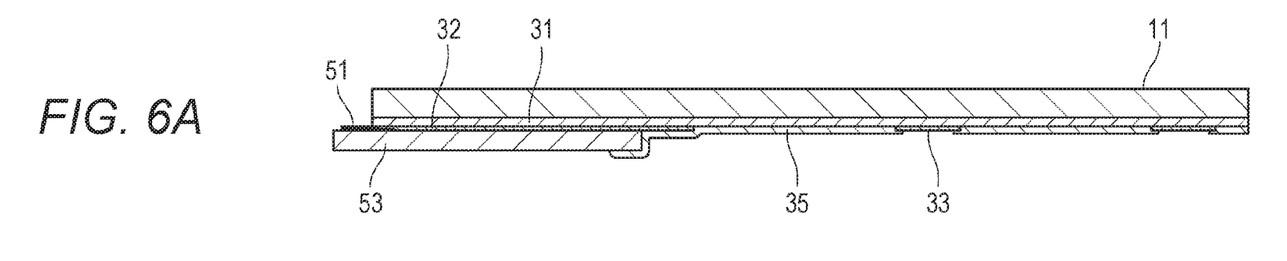
FIGS. 6A and 6B are for describing the step of detaching an adhesive layer separator.
Figure 6B:
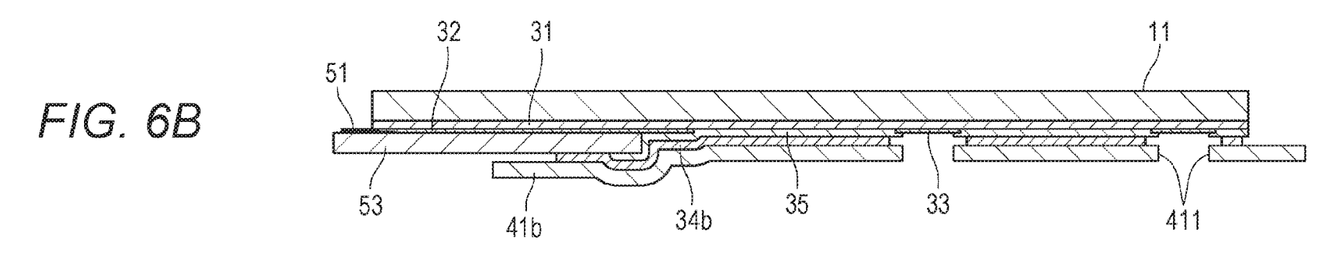
Figure 6C:
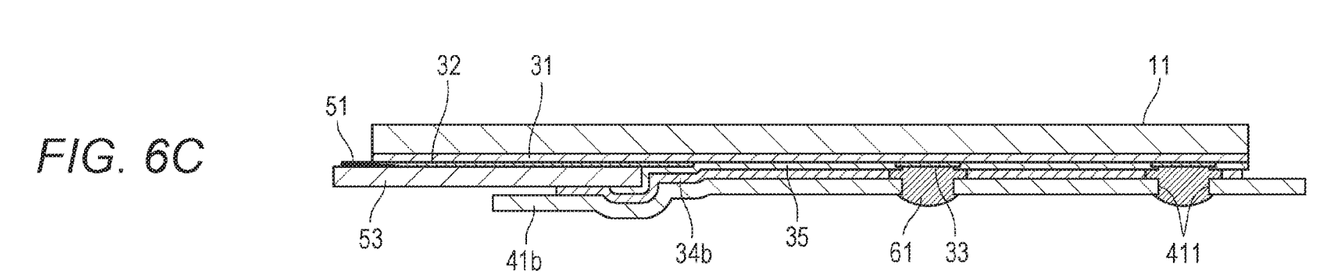
FIG. 6C is for describing the step of bonding an adhesive layer member 34 and a stretchable-base-material-side member to each other.
Figure 7A:
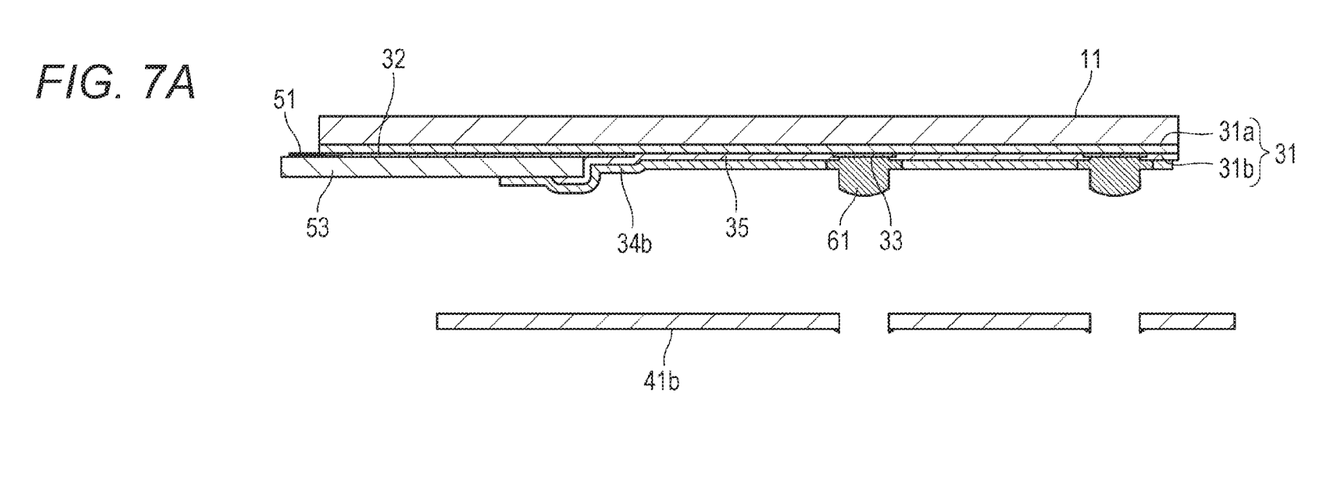
FIGS. 7A and 7B are for describing the method for bonding the stretchable circuit board.
Figure 7B:
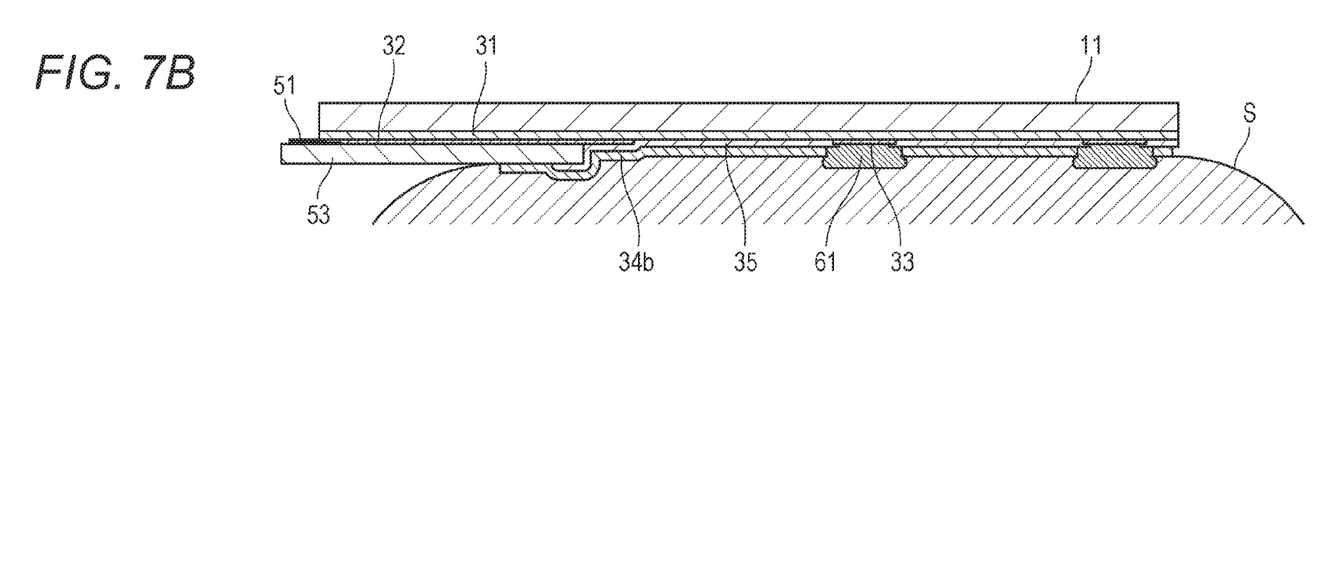

Next, the method for manufacturing the stretchable circuit board 1 described above will be described. The method for manufacturing the stretchable circuit board 1 of the present embodiment includes a step A and a step B. At the step A, an adhesive layer separator 44b is detached from the adhesive layer 34b having the adhesive layer separator 44b as a first adhesive layer separator bonded to a first surface and the adhesive layer separator 41b as a second adhesive layer separator bonded to the back surface of the first surface and having the openings 411. At the step B, the adhesive layer 34b to which the adhesive layer separator 41b is bonded and the stretchable base material 31 having the electrodes 33 formed on at least one main surface and the stretchable wiring lines 32 formed connected to the electrodes 33 are position-adjusted. Such position adjustment is performed such that the opening 411 corresponds to the position of the electrode 33. Then, the adhesive layer 34b is directly or indirectly bonded to the back surface 31b. Hereinafter, such a step including the step A and the step B will be described. FIGS. 3A to 7B are for description from the method for manufacturing the stretchable circuit board 1 to use of the stretchable circuit board 1 after completion. Of these figures, FIGS. 3A to 5D are for describing the method for manufacturing an adhesive layer sheet 5. The adhesive layer sheet 5 is a member obtained in such a manner that the adhesive layer separators 41b and 44b are bonded to the adhesive layer 34b. The adhesive layer separator 44b of the adhesive layer sheet 5 is detached. Then, the adhesive layer 34b is bonded to the side of the stretchable base material 31. FIGS. 6A to 6C are for describing the step of bonding the adhesive layer 34b to the stretchable base material 31 via the stretchable cover 35. The step A and the step B are included in this step. FIGS. 7A and 7B are for describing the method for attaching the stretchable circuit board 1 to the living body. Note that all of FIGS. 3A to 7B are longitudinal sectional views of the stretchable circuit board or the stretchable circuit board in the course of a manufacturing step from the side of arrows A and A of FIG. 2A.

In the present embodiment, the adhesive layer sheet 5 is manufactured prior to the step A and the step B. Hereinafter, the step of manufacturing the adhesive layer sheet 5 will be described.

(Manufacturing of Adhesive Layer Sheet)

Figure 3A:
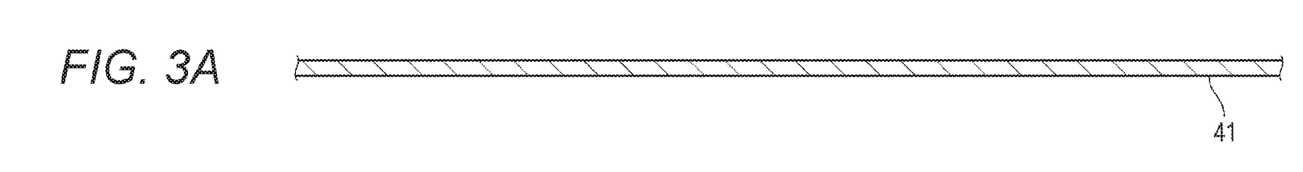
FIGS. 3A, 3B, 3C, and 3D) are for describing the step of manufacturing an adhesive layer sheet of the present embodiment.
Figure 3B:
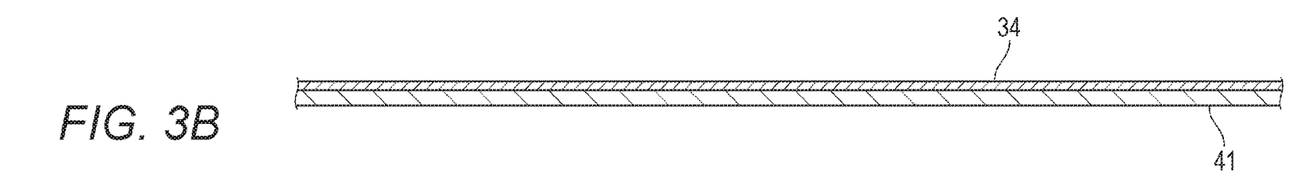
Figure 3C:
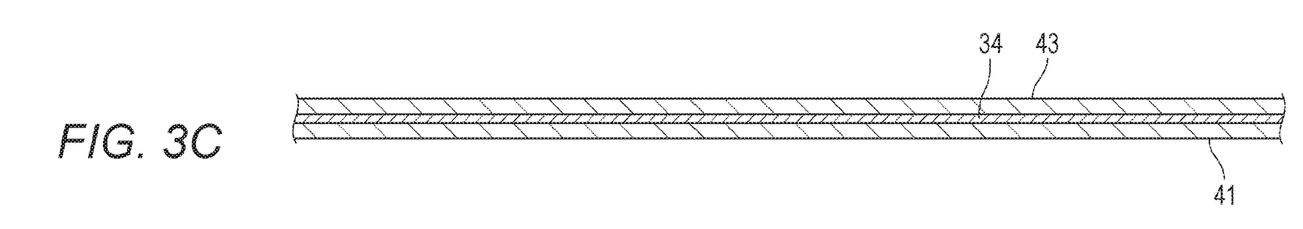

As illustrated in FIG. 3A, a separator member 41 is first prepared at the step of manufacturing the stretchable circuit board 1 in the present embodiment. At this point, the separator member 41 is preferably in a rolled state. Then, the separator member 41 in the rolled state is coated with a coating agent for forming the adhesive layer 34b by, e.g., a coating method. This coating agent is, for example, cured by dryer drying for two minutes at 100° C. Thus, the coating agent is manufactured in such a manner that a curing agent is added to a base agent and a fast-drying solvent is further added. The coating agent forms an adhesive layer member 34 after curing (FIG. 3B). After formation of the adhesive layer member 34, a separator member 43 is bonded to the adhesive layer member 34 as illustrated in FIG. 3C in the present embodiment. The configuration including the separator members 41 and 43 bonded to the upper and lower sides of the adhesive layer member 34 as viewed in the figure is also called a "double separator".

Figure 3D:
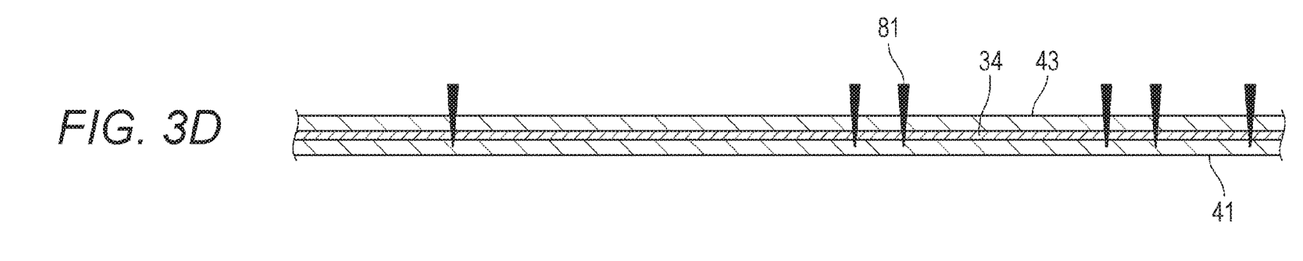

FIG. 3D is for describing the step of pressing (punching) the adhesive layer member 34 of the double separator. At this pressing step, unnecessary portions of the separator member 43 and the adhesive layer member 34 are removed. At the pressing step, blades 81 of a pressing die of a not-shown pressing machine are pressed against the separator member 43 from the side (from above in the present embodiment) of the separator member 43. In this manner, cuts are made at the separator member 43 and the adhesive layer member 34. At this point, in the present embodiment, the separator member 41 is half-cut such that the blades 81 also enter the separator member 41 to a depth corresponding to about the half of the thickness of the separator member 41 or a depth less than the half of the thickness of the separator member 41. Note that the adhesive layer member 34 illustrated in FIGS. 3D to 5B may be continuously processed by drawing of the adhesive layer member 34 from the rolled state. Alternatively, the cut adhesive layer members 34 may be separately processed.

That is, in the method for manufacturing the stretchable circuit board 1 of the present embodiment, the adhesive layer separator 41b has cut grooves 412 extending from a surface on the side of the adhesive layer 34b to a surface on the other side. The cut grooves 412 are arranged at a boundary between a region where the adhesive layer 34b is formed and a region where no adhesive layer 34b is formed. By such a step, the unnecessary portions of the adhesive layer member 34 can be reliably removed from the separator member 41 in the present embodiment. Further, cut portions (the cut grooves) 412 are formed at the separator member 41 by half cutting. The adhesive layer separator 41b is bent at the cut grooves 412 when the adhesive layer separator 41b is detached from the adhesive layer 34b afterward. A bent end portion is provided as a "tab" of the adhesive layer separator 41b in the process of detaching the adhesive layer separator 41b. In this manner, a detachment process can be facilitated.

Figure 4A:
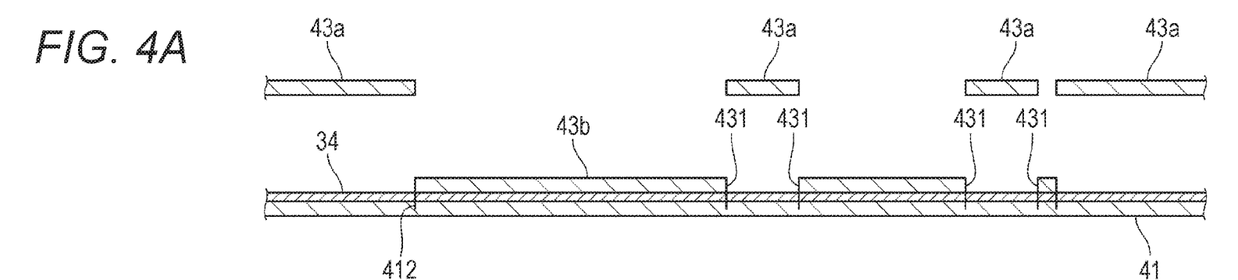
FIGS. 4A, 4B, and 4C are for describing the step of manufacturing the adhesive layer sheet of the present embodiment, and any of the figures is for describing the step performed after the step illustrated in FIGS. 3A to 3C.

FIG. 4A illustrates a state when the unnecessary portions of the separator member 43 having the cuts made at the pressing step are detached and removed. In FIG. 4A, portions of the separator member 43 to be removed will be referred to as "removal target portions 43a", and a portion of the separator member 43 remaining on the adhesive layer member 34 will be referred to as a "remaining portion 43b". By removal of the removal target portions 43a, openings 431 are formed at the remaining portion 43b. In addition, the unnecessary portions of the adhesive layer member 34 are exposed. Moreover, by removal of the removal target portions 43a, steps are formed at the openings 431. For reducing these steps, the thickness of the separator member 43 is preferably small.

Of the separator member 43, the remaining portion 43b is detached from the adhesive layer 34b with the separator member 41 being bonded to the adhesive layer 34b. At this point, for reducing detachment of the adhesive layer 34b from the separator member 41 together with the remaining portion 43b, adhesive force (N1) between the adhesive layer 34b and the remaining portion 43b is, in the present embodiment, set weaker than adhesive force (N2) between the adhesive layer 34b and the separator member 41 (N1<N2). Note that the adhesive force between the adhesive layer 34b and each of the separator member 41 and the remaining portion 43b can be, for example, adjusted in such a manner that a combination of the separator member 41, a base material of the remaining portion 43b, and the remover is selected as necessary. Note that even at the step of bonding the separator member 43 as illustrated in FIG. 3C, the separator members 41 and 43 are preferably in a rolled state. The separator members 41 and 43 and the adhesive layer member 34 illustrated in FIG. 3C are rolled up and sent to a subsequent step.

Figure 4B:
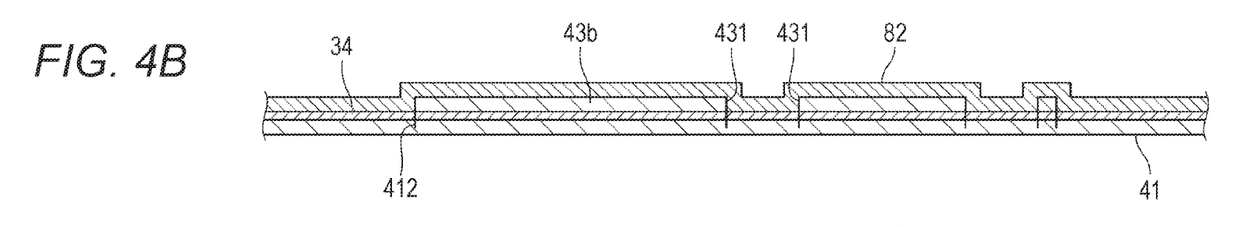

Next, in the present embodiment, detachable paper 82 is bonded onto the remaining portion 43b and the adhesive layer member 34 as illustrated in FIG. 4B. In addition to paper, a resin film such as a PET film may be provided as a base material.

Figure 4C:
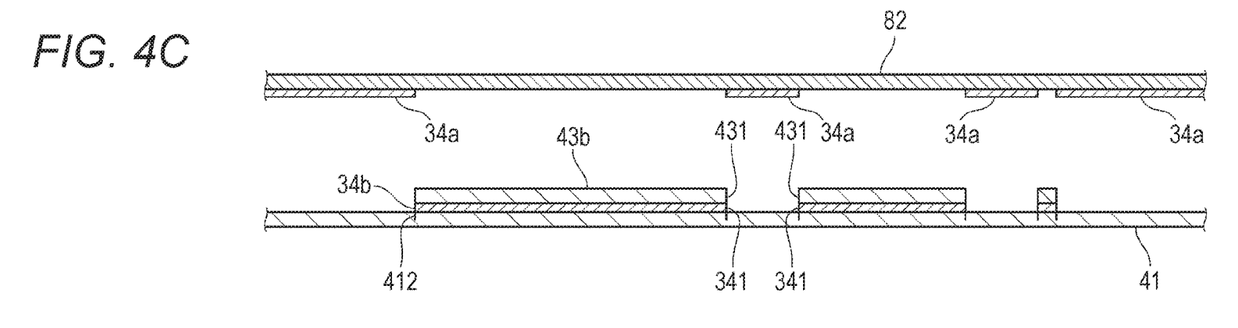

FIG. 4C illustrates a state when unnecessary portions 34a of the adhesive layer member 34 are removed by detachment of the detachable paper 82. In FIG. 4C, the unnecessary portions 34a of the adhesive layer member 34 are removed. The remaining adhesive layer member 34 serves as the adhesive layer 34b. By removal of the unnecessary portions 34a, openings 341 are formed at the adhesive layer 34b.

Figure 5A:
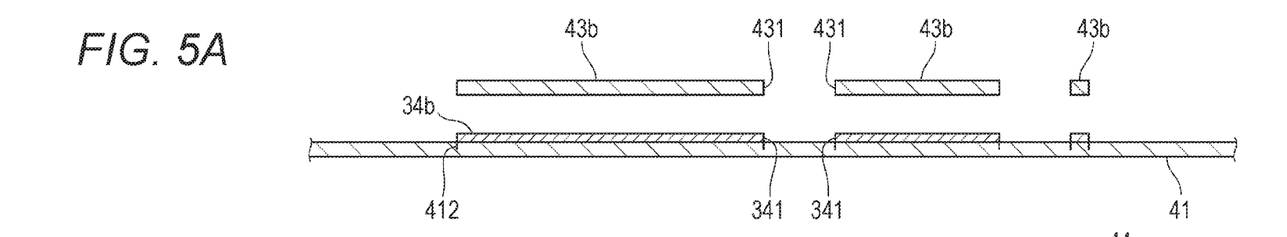
FIGS. 5A, 5B, 5C, and 5D are for describing the step of manufacturing the adhesive layer sheet of the present embodiment, and any of the figures is for describing the step performed after the step illustrated in FIGS. 4A to 4C.
Figure 5B:
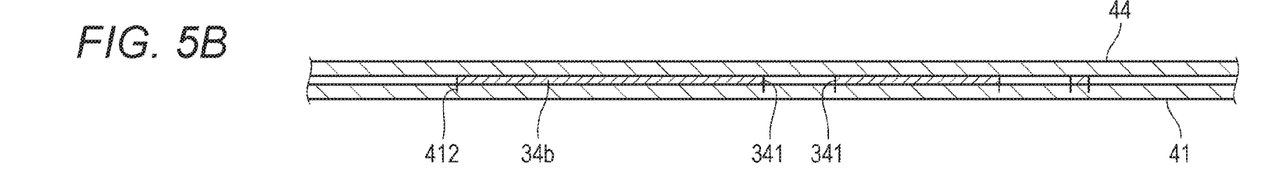

FIG. 5A illustrates a state when the remaining portion 43b is detached from the adhesive layer 34b. By detachment of the remaining portion 43b, the adhesive layer 34b is exposed. Next, in the present embodiment, the separator member 44 is bonded onto the adhesive layer 34b as illustrated in FIG. 5B. The separator member 44 is configured to reduce a change in adhesive force due to, e.g., dust adhering to the adhesive layer 34b. In addition, the separator member 44 has the function of facilitating cutting of the pressing step to be continuously performed. Moreover, at a subsequent step, the adhesive layer separator 44b (FIG. 5C) of the separator members 41 and 44 is detached from the adhesive layer 34b with the adhesive layer separator 41b being bonded to the adhesive layer 34b.

Figures 5C, 5D:
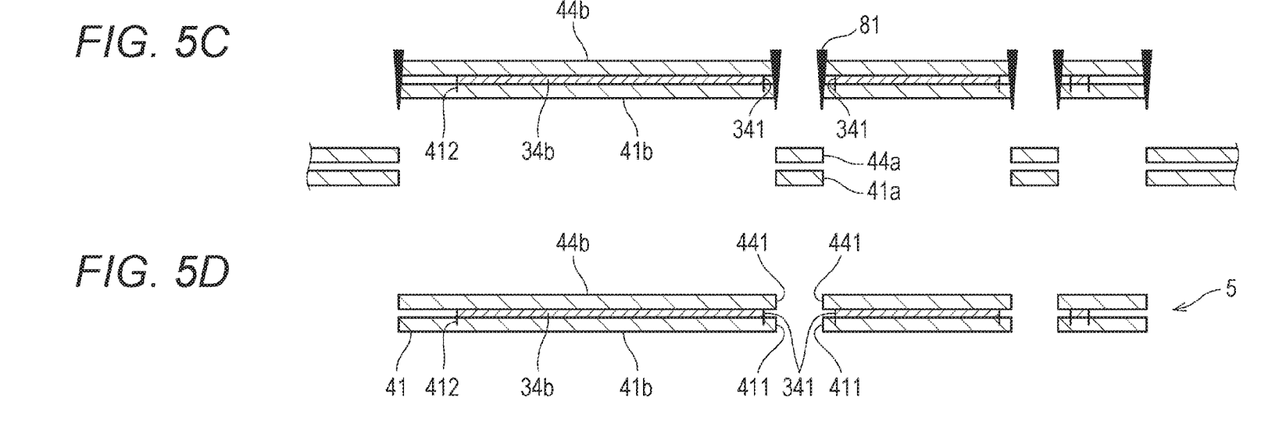

Next, in the present embodiment, the blades 81 of the pressing die pressed against the separator member 44 from above cut the separator members 41 and 44 as illustrated in FIG. 5C. In FIG. 5C, removed portions of the separator member 44 will be referred to as "removed portions 44a", and a portion of the separator member 44 remaining on the adhesive layer 34b will be referred to as the "adhesive layer separator 44b". By removal of the removed portions 44a, openings 441 are formed at the adhesive layer separator 44b. Moreover, removed portions of the separator member 41 will be referred to as "removed portions 41a", and a portion of the separator member 41 bonded to and remaining on the adhesive layer 34b will be referred to as the "adhesive layer separator 41b". By removal of the removed portions 41a, the openings 411 are formed at the adhesive layer separator 41b. By the above-described steps, the adhesive layer sheet 5 as a member is formed. As illustrated in FIG. 5D, the openings 411 of the adhesive layer separator 41b and the openings 441 of the adhesive layer separator 44b slightly protrude to an opening center with respect to the openings 341. In other words, the opening diameters of the openings 411 and 441 are smaller than that of the opening 341. With this configuration, the adhesive layer 34b is, in the present embodiment, not exposed through the adhesive layer separators 41b and 44b. Thus, oozing of the adhesive layer 34b can be reduced.

(Step A)

FIG. 6A is a sectional view of the configuration in which the adhesive layer sheet 5 is removed from the stretchable circuit board 1 illustrated in FIGS. 2A and 29. In the present embodiment, the adhesive layer separator 44b of the adhesive layer sheet 5 illustrated in FIG. 5D is detached.

(Step B)

Next, after detachment of the adhesive layer separator 44b, the adhesive layer 34b is bonded to the back surface 31b of the stretchable base material 31 via the stretchable cover 35 as illustrated in FIG. 613. At this point, in the present embodiment, the adhesive layer 34b to which the adhesive layer separator 41b is bonded is bonded to the stretchable base material 31 illustrated in FIG. 6A such that the openings 411 correspond to the electrodes 33. That is, in the present embodiment, when the adhesive layer 34b is bonded to the stretchable base material 31, the stretchable base material 31 and the adhesive layer separator 41b are position-adjusted using, e.g., a not-shown position adjustment mark. By position adjustment, the stretchable cover 35 and the adhesive layer 34b are bonded to each other such that the electrodes 33 and the openings 411 overlap with each other in the vertical direction of the stretchable base material 31.

As illustrated in FIG. 6C, conductive cream 61 is applied to the stretchable circuit board 1 manufactured by the above-described steps from above the adhesive layer separator 41b. Then, by detachment of the adhesive layer separator 41b, the conductive cream 61 can be present only on the electrodes 33 as illustrated in FIG. 7A. Upon detachment of the adhesive layer separator 41b illustrated in FIG. 7A, the stretchable base material separator 11 is bonded to the front surface 31a of the stretchable base material 31. For reducing detachment of the stretchable base material separator 11 from the stretchable base material 31 upon detachment of the adhesive layer separator 41b, adhesive force between the adhesive layer separator 41b and the adhesive layer 34b is set smaller than adhesive force between the stretchable base material 31 and the stretchable base material separator 11. After detachment of the adhesive layer separator 41b, the stretchable circuit board 1 is attached to a living body S via the adhesive layer 34b. The stretchable base material separator 11 is detached from the stretchable circuit board 1 after attachment thereof. Then, the stretchable circuit board 1 can freely stretch in association with irregularity and motion of a surface of the living body S. Note that in the present embodiment, the stretchable base material separator 11 is directly bonded to the stretchable base material 31. Note that the present embodiment is not limited to such a configuration. The stretchable base material separator 11 may be indirectly bonded to the stretchable base material 31 via other members.

The stretchable base material 31 of the stretchable circuit board 1 described above has the stretchability. The stretchable wiring lines 32 are provided on one main surface of the stretchable base material 31. Thus, this stretchable circuit board can stretch along a surface with fine irregularity, such as a living body surface. Moreover, the stretchable wiring lines 32 and the electrodes 33 are formed on the stretchable base material 31. Thus, the wiring lines can also stretch in association with stretching of the stretchable base material 31. Moreover, in the present embodiment, the adhesive layer 34b is bonded to the main surface of the stretchable base material 31. Thus, the stretchable base material 31 can be attached in close contact with the living body, etc. Consequently, the stretchable base material 31 close contacts the living body, etc. As a result, an electric signal with a small value, such as a biosignal, can be detected with high accuracy. Moreover, the adhesive layer 34b is formed in other regions than the electrode regions A1 including the electrodes 33. Thus, the adhesive layer 34b interposed between each electrode 33 and the living body, etc. does not lower signal detection accuracy.

Moreover, in the present embodiment, the adhesive layer separator 41b having the opening 411 formed in at least part of each electrode region A1 is detachably bonded to the adhesive layer 34b. Thus, the electrodes 33 are exposed through the separator member 41. The conductive cream 61 can be easily and selectively applied onto only the electrodes 33 in such a manner that the adhesive layer separator 41b is detached after the conductive cream 61 has been applied from above the adhesive layer separator 41b. Thus, according to the present embodiment, influence of the conductive cream 61 on measurement of the biosignal can be reduced.

The embodiment of the present disclosure as described above is not limited to description above. As long as an objective of the embodiment of the present disclosure is accomplished, embodiments to which various changes or modifications are made are also included in embodiments of the present disclosure. For example, various components of the stretchable circuit board of the present disclosure are not necessarily independent from each other For example, formation of multiple components as a single member, formation of a single component from multiple members, formation of a certain component as part of other components, and overlapping between part of a certain component and part of other components are allowed.

The above-described embodiment includes the following technical ideas:

<1> A stretchable circuit board including a stretchable base material having stretchability and including a stretchable wiring line on one main surface an electrode formed on at least the main surface of the stretchable base material and connected to the stretchable wiring line; an adhesive layer directly or indirectly bonded to the main surface on which the electrode is formed and formed in a non-electrode region as a region other than an electrode region corresponding to the electrode; and an adhesive layer separator detachably bonded to the adhesive layer and having an opening at at least part of the electrode region.

<2> The stretchable circuit board of <1>, in which the electrode region provided with no adhesive layer embeds the opening of the adhesive layer separator.

<3> The stretchable circuit board <1> or <2>, in which the stretchable base material is provided on the main surface, and a cover member configured to protect the stretchable wiring line is provided between the main surface of the stretchable base material and the adhesive layer.

<4> The stretchable circuit board of any one of <1> to <3>, which further includes a stretchable base material separator directly or indirectly bonded to a back surface of the main surface of the stretchable base material, adhesive force between the adhesive layer separator and the adhesive layer being smaller than adhesive force between the stretchable base material and the stretchable base material separator.

<5> The stretchable circuit board of any one of <1> to <4>, in which the adhesive layer separator has a cut groove extending from a surface on an adhesive layer side to a surface on the other side at a boundary between a region where the adhesive layer is formed and a region where no adhesive layer is formed.

<6> The stretchable circuit board of any one of <1> to <5>, which further includes a packing material configured to separately embed the stretchable base material, the adhesive layer, and the adhesive layer separator.

<7> The method for manufacturing a stretchable circuit board, which includes the step of detaching a first adhesive layer separator from an adhesive layer configured such that the first adhesive layer separator is bonded to a first surface and a second adhesive layer separator having an opening is bonded to a back surface of the first surface; and the step of directly or indirectly bonding the adhesive layer to which the second adhesive layer separator is bonded to at least one main surface of a stretchable base material configured such that an electrode is formed on the at least one main surface and a stretchable wiring line is formed connected to the electrode such that the opening is position-adjusted corresponding to the position of the electrode.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A stretchable circuit board comprising:
   a stretchable base material having stretchability and including a stretchable wiring line on one main surface;
   an electrode formed on at least the main surface of the stretchable base material and connected to the stretchable wiring line;
   an adhesive layer directly or indirectly bonded to the main surface on which the electrode is formed and formed in a region of the main surface other than an electrode region including the electrode; and
   an adhesive layer separator detachably bonded to the adhesive layer and having an opening formed at a position corresponding to at least part of the electrode region.

2. The stretchable circuit board according to claim 1, wherein
   at least part of the electrode region is exposed through the opening of the adhesive layer separator.

3. The stretchable circuit board according to claim 1, wherein
   the stretchable base material has a cover member formed between the main surface of the stretchable base material and the adhesive layer.

4. The stretchable circuit board according to claim 1, further comprising:
   a stretchable base material separator directly or indirectly bonded to a back surface of the main surface of the stretchable base material,
   wherein adhesive force between the adhesive layer separator and the adhesive layer is smaller than adhesive force between the stretchable base material and the stretchable base material separator.

5. The stretchable circuit board according to claim 1, wherein
   the adhesive layer separator has a cut groove extending from a surface on an adhesive layer side to a surface on the other side at a boundary between a region where the adhesive layer is formed and a region where no adhesive layer is formed.

6. The stretchable circuit board according to claim 1, further comprising:
   a packing material configured to separately embed the stretchable circuit board.

* * * * *